(12) United States Patent
Ma

(10) Patent No.: US 9,172,372 B2
(45) Date of Patent: *Oct. 27, 2015

(54) APPARATUSES, CIRCUITS, AND METHODS FOR REDUCING METASTABILITY IN DATA SYNCHRONIZATION

(71) Applicant: MICRON TECHNOLOGY, INC., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,263

(22) Filed: Aug. 11, 2014

(65) Prior Publication Data

US 2014/0347099 A1 Nov. 27, 2014

Related U.S. Application Data

(63) Continuation of application No. 13/443,856, filed on Apr. 10, 2012, now Pat. No. 8,824,612.

(51) Int. Cl.
  *H03K 19/003* (2006.01)
  *G11C 7/22* (2006.01)
  *H03L 7/081* (2006.01)
  *G11C 7/10* (2006.01)
  *H03K 3/037* (2006.01)

(52) U.S. Cl.
  CPC ........ *H03K 19/00346* (2013.01); *G11C 7/1009* (2013.01); *G11C 7/222* (2013.01); *H03K 3/0375* (2013.01); *H03L 7/0814* (2013.01); *H03L 7/0816* (2013.01); *H03L 7/0818* (2013.01)

(58) Field of Classification Search
  CPC ........... H03K 19/00346; H03K 3/0375; H03L 7/0814; H03L 7/0816; H03L 7/0818; G11C 7/222; G11C 7/1009
  USPC ............................................. 375/354; 326/94
  See application file for complete search history.

(56) References Cited

U.S. PATENT DOCUMENTS

| 5,764,710 | A | 6/1998 | Cheng et al. |
| 6,741,668 | B1 | 5/2004 | Nakamura |
| 7,135,905 | B2 | 11/2006 | Teo et al. |
| 7,251,304 | B2 | 7/2007 | Fukushima |
| 7,359,468 | B2 | 4/2008 | Danzig et al. |
| 8,824,612 | B2 * | 9/2014 | Ma ................................ 375/354 |
| 2013/0265090 | A1 | 10/2013 | Ma |

OTHER PUBLICATIONS

Kleeman, Lindsay et al., "Can Redundancy and Masking Improve the Performance of Synchronizers?", IEEE Transactions on Computers, vol. c-35, No. 7, Jul. 1986, 643-646.
Kleeman, Lindsay et al., "Metastable Behavior in Digital Systems", IEEE Design & Test of Computers, University of Newcastle, New South Wales, Dec. 1987, 4-19.

* cited by examiner

*Primary Examiner* — Leon Flores
(74) *Attorney, Agent, or Firm* — Dorsey & Whitney LLP

(57) ABSTRACT

Apparatuses, circuits, and methods are disclosed for reducing or eliminating unintended operation resin ling from metastability in data synchronization. In one such example apparatus, a sampling circuit is configured to provide four samples of a data input signal. A first and a second of the four samples are associated with a first edge of a latching signal, and a third and a fourth of the four samples are associated with a second edge of the latching signal. A masking circuit is configured to selectively mask a signal corresponding to one of the four samples responsive to the four samples not sharing a common logic level. The masking circuit is also configured to provide a decision signal responsive to selectively masking or not masking the signal.

21 Claims, 9 Drawing Sheets

US 9,172,372 B2

APPARATUSES, CIRCUITS, AND METHODS FOR REDUCING METASTABILITY IN DATA SYNCHRONIZATION

CROSS REFERENCE TO RELATED APPLICATION(S)

This application is a continuation of U.S. patent application Ser. No. 13/443,856, filed Apr. 10, 2012 and issued as U.S. Pat. No. 8,824,612 B2 on Sep. 2, 2014. This application and patent are incorporated herein by reference, in their entirety, for any purpose.

TECHNICAL FIELD

Embodiments of the invention relate generally to integrated circuits, and more particularly, in one or more of the illustrated embodiments, to reducing or eliminating metastability in data synchronization.

BACKGROUND OF THE INVENTION

Metastability is a reliability concern where a plurality of different signals are provided to a circuit at the same or at nearly the same time, including where an asynchronous signal is to be synchronized with a latching signal (e.g., a clock signal). In a rising edge triggered flip-flop, for example, if an input signal transitions right before a rising clock edge and violates the setup time of the flip-flop, if the input signal transitions at the same time as the rising clock edge, or if the input signal transitions right after the rising clock edge and violates the hold time of the flip-flop, then the flip-flop may at least temporarily enter a metastable state. The metastable state may be that one or more nodes of the flip-flop are at an invalid logic level (e.g., somewhere between a logic high and a logic low). The invalid logic level may result from the one or more nodes not being fully charged or discharged when the flip-flop latches the input signal at the rising clock edge because, for example, the one or more nodes did not get fully pulled-up or fully pulled-down.

When a flip-flop, for example, enters a metastable state, the output of the flip-flop may be incorrect in that it does not correspond to the input signal provided to the flip-flop. The output may, for example, linger at an invalid logic level for an unacceptable period of time. Alternatively, or in addition to the output lingering at an invalid logic level, the output may not correctly correspond to the input signal because the output may transition too early or too late (i.e., have an incorrect phase). In some cases, the phase of the output will be correct, but the width of the output pulse will be incorrect. The lingering, the incorrect phase, and/or the incorrect pulse width resulting from the metastability may cause unintended operation of a circuit or apparatus that receives the output of the flip-flop.

The conventional approach to preventing unintended operation resulting from metastability includes chaining one or more flip-flops in series to help prevent lingering output signals from propagating to a subsequent circuit. Although such serial chaining of flip-flops may reduce the likelihood that the output signal of the serial chain lingers, this approach generally does not address the root cause of the metastability (e.g., latch nodes that do not get fully charged or discharged before the flip-flop latches) and instead simply mitigates some of the consequences from when a flip-flop experiences metastability. Furthermore, serial chaining of flip-flops tends to consume power, present additional clock and signal loading, and add delay to a signal path, all of which may be undesirable in some cases.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
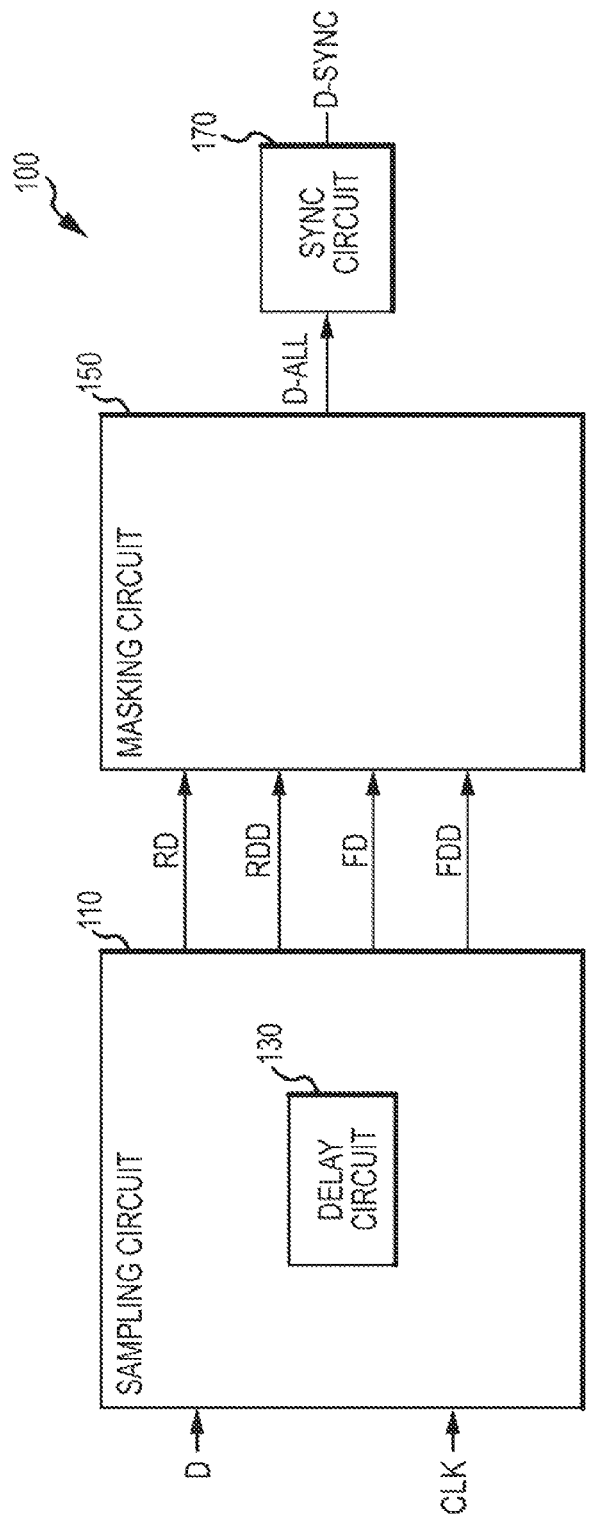
FIG. 1 is a block diagram of an apparatus according to an embodiment of the present invention.

FIG. 1 illustrates an apparatus 100 according to an embodiment of the invention. The apparatus 100 receives a data input signal D and a latching signal CLK. The data input signal D may be asynchronous in some embodiments. The latching signal CLK may be a dock signal in some embodiments, although in other embodiments, a gating signal or any other type of latching signal may be used. In some embodiments the apparatus 100 also receives another latching signal CLKF (not illustrated in FIG. 1). In other embodiments, however, the apparatus 100 may only receive the latching signal CLK and not CLKF. In apparatuses that only receive the latching signal CLK, the latching signal CLKF may in some embodiments be generated internally responsive to the latching signal CLK. The latching signal CLKF may in some embodiments be substantially complementary to the latching signal CLK. The apparatus 100 provides an output signal D-SYNC, and in some embodiments may also provide another output signal D-SYNCF (not illustrated in FIG. 1). The output signal D-SYNCF may in some embodiments be substantially complementary to the output signal D-SYNC.

The apparatus 100 includes a sampling circuit 110 and a masking circuit 150. As explained in more detail below, the sampling circuit 110 and the masking circuit 150 may help reduce or eliminate metastability in the apparatus 100 and may help prevent the output signal D-SYNC of the apparatus 100 from lingering and/or from having an incorrect phase and/or an incorrect pulse width as compared with the data input signal D. For example, if the apparatus 100 is used to synchronize the data input signal D, the output signal D-SYNC of the apparatus 100 may not enter a metastable condition.

The sampling circuit 110 receives and samples the data input signal D to provide a plurality of samples and corresponding signals. The sampling circuit 110 provides a first signal RL) corresponding to a first sample of the data input signal D, a second signal RDD corresponding to a second sample of the data input signal D, a third signal FD corresponding to a third sample of the data input signal D, and a fourth signal FDD corresponding to a fourth sample of the data input signal. In some embodiments, the first signal RD provided by the sampling circuit 110 corresponds to a sample of the data input signal D at a rising edge of the latching signal CLK and the second signal RDD provided by the sampling circuit 110 corresponds to a delayed sample of the data input signal D at a rising edge of the latching signal CLK. The third signal FD provided by the sampling circuit 110 may correspond to a sample of the data input signal D at a falling edge of the latching signal CLK and the fourth signal FDD provided by the sampling circuit 110 may correspond to a delayed sample of the data input signal D at a falling edge of the latching signal CLK. In this manner, the first and second samples and their corresponding signals RD, RDD are associated with a rising edge of the latching signal CLK and the third and fourth samples and their corresponding signals FD, FDD are associated with a falling edge of the latching signal CLK.

As explained in more detail below, the second and fourth samples and their corresponding signals RDD, FDD may be provided by delaying the data input signal D and/or by delaying the latching signal CLK. Accordingly, the sampling circuit 110 includes one or more delay circuits 130 configured to delay the data input signal D and/or to delay the latching signal CLK. The delay circuit 130 delays the data input signal D and/or the latching signal CLK by a delay tD. The tD delay may in some embodiments be a delay of less than half of a period of the latching signal CLK, and may in some embodiments be approximately one fourth of such period. The tD delay may be variable and/or configurable in some embodiments; for example, the tD delay may be configurable between a first delay tD1 and a second delay tD2.

The apparatus 100 illustrated in FIG. 1 also includes a masking circuit 150. The masking circuit 150 receives the first, second, third and fourth signals RD, RDD, FD, FDD (corresponding to the first, second, third, and fourth samples described herein) from the sampling circuit 110 and, in response, provides a decision signal D-ALL. As explained in more detail below, the masking circuit 150 may selectively mask one or more of the signals RD, RDD, FD, FDD responsive to one or more of the first, second, third, and fourth samples not sharing a common logic level with one or more of the other samples. The samples may not share a common logic level if the data input signal D transitions, for example, from a logic high to a logic low or from a logic low to a logic high near the rising edge of the latching signal CLK, in between the rising and falling edge of the latching signal CLK, and/or near the falling edge of the latching signal CLK. Masking the signal or signals RD, RDD, FD, FDD therefore serves to mask the transition of the data input signal D by delaying the output signal D-SYNC of the apparatus 100 from transitioning until a subsequent point in time (e.g., a subsequent clock cycle). In order to help prevent the output signal D-SYNC of the apparatus 100 from being at an invalid logic level due to metastability, the masking circuit 150 may therefore selectively mask a transition of the data input signal D by delaying the propagation of the transition of the data input signal D to the output signal D-SYNC until the next rising edge of the latching signal CLK. Such selective masking may help prevent metastability because if the width of a pulse of the data input signal D is wider than half of a clock period of the latching signal CLK, then it is unlikely that samples corresponding to a rising and immediately following falling edge of the latching signal CLK are both invalid logic levels due to metastability. The masking circuit 150 thus provides the decision signal D-ALL responsive to the selective masking of the signals (in other words, based on the selective masking of the data input signal D transition).

The apparatus 100 illustrated m FIG. 1 also includes a sync circuit 170. The sync circuit receives the decision signal D-ALL from the masking circuit 150 and also receives the latching signal CLK in some embodiments. Responsive to receiving the decision signal D-ALL from the masking circuit, and also responsive also to the latching signal CLK, the sync circuit 170 provides an output signal D-SYNC at its output. The sync circuit may help synchronize the data input signal D with either the rising or falling edge of the latching signal CLK. As described in more detail in connection with FIGS. 6A through 6C, the sync circuit may include, for example a level sensitive latch, a flip-flop, and so forth.

The apparatus 100 may be used for data synchronization in some embodiments. For example, an asynchronous signal may be provided as the data input signal D to the apparatus 100, and the apparatus 100 may help synchronize the data input signal D with the latching signal CLK without experiencing metastability. The asynchronous signal may be asynchronous in that it is unrelated to the latching signal CLK— for example, the asynchronous signal may come from an external output with unknown timing, or may come from a circuit with a different clock domain than the latching signal CLK. The apparatus 100 may however, also be used in partially or fully synchronous circuits as well.

In operation, the sampling circuit 110 of the apparatus 100 may sample the data input signal D responsive to each rising edge of the latching signal CLK to obtain the first and second samples of data for corresponding signals RD, RDD. The sampling circuit 110 of the apparatus 100 may also sample the data input signal D responsive to each falling edge of the latching signal CLK to obtain the third and fourth samples of data for corresponding signals FD, FDD. The RD, RDD, FD, and FDD signals may be provided to the masking circuit 150, which may selectively mask a transition of the data input signal D (by, for example, masking one or more of the signals RD, RDD, PD, FDD) in providing the decision signal D-ALL. The sync circuit 170 in turn synchronizes the decision signal D-ALL with the rising (or falling) edge of the latching signal CLK.

Figure 2A:
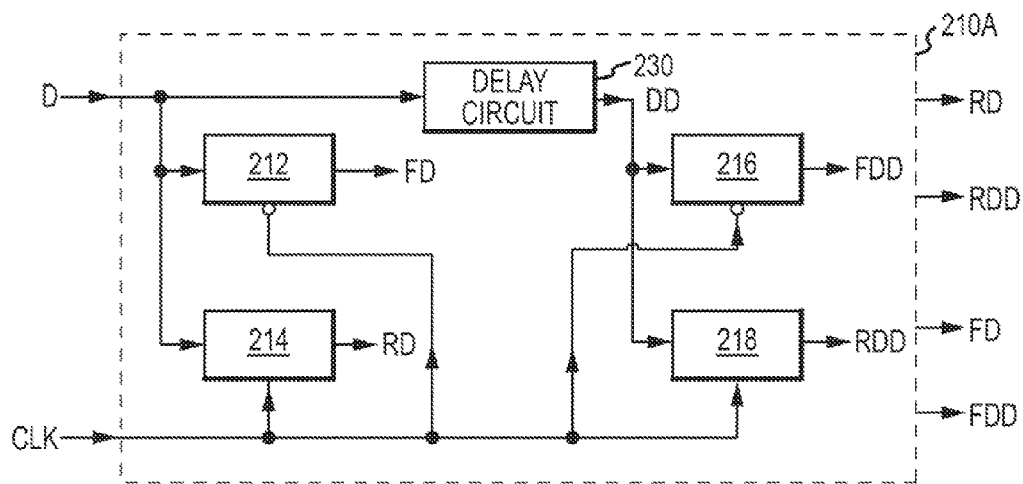
FIG. 2A is a schematic diagram of a sampling circuit according to an embodiment of the invention.

FIG. 2A illustrates one embodiment of a sampling circuit 210A that may be used in the apparatus 100 illustrated in FIG. 1. The sampling circuit 210A includes four latching circuits 212, 214, 216, 218. The latching circuits 212, 214, 216, 218 may be level sensitive latches, rising edge triggered flip-flops, falling edge triggered flip-flops, or any other type of latching circuit. A latching signal (e.g., CLK) is provided to each of the latching circuits 212, 214, 216, 218. As illustrated in FIG. 2, a single latching signal CLK may be provided to each of the four latching circuits 212, 214, 216, 218. In these embodiments, two of the latching circuits 212, 214 may be sensitive to falling edges of the latching signal CLK, while two of the latching circuits 216, 218 may be sensitive to rising edges of the latching signal CLK. In other embodiments, however, one latching signal CLK is provided to two of the latching circuits 214, 218, and a complementary latching signal CLKF is provided to the other two latching circuits 212, 216, with all four latching circuits 212, 214, 216, 218 sensitive to either the falling or rising edges of the latching signals CLK, CLKF (not illustrated in FIG. 2). In still other embodiments, substantially complementary latching signals CLK, CLKF may both be provided to the sampling circuit 210A and to each of the latching circuit 212, 214, 216, 218 within the sampling circuit 210A. Also as illustrated in FIG. 2A, the data input signal D is provided to two of the latching circuits 212, 214 and to a delay circuit 230. The delay circuit 230 delays the data input signal D by a tD delay, and provides a delayed data signal DD to the two latching circuits 216, 218 that do not receive the original data input signal D.

The delay circuit 230 that delays the data input signal D by a tD delay and provides the delayed data signal DD may be any type of delay circuit. For example, the delay circuit 230 may include a buffer (e.g., formed from two or four serially coupled inverters), may include an analog RC circuit, and so forth. As mentioned above, in some embodiments, the tD delay provided by the delay circuit 230 may be variable and/or may be enabled and disabled. For example, the delay circuit 230 may receive a control signal (not illustrated in FIG. 2A) indicating that the delay circuit 230 should not delay the data input signal D by the tD delay but instead should pass the original data input, signal D as its output DD, or the delay circuit 230 may receive a control signal (not illustrated in FIG. 2A) indicating that the delay circuit 230 should provide a shorter or a longer tD delay to delay the data input signal D. In general, the delay circuit 230 may be configured to provide many different lengths of a delay (including no delay) in some embodiments.

In operation, the sampling circuit 210A illustrated in FIG. 2A captures four samples for each pulse of the latching signal CLK (e.g., for each pair of a rising edge and a falling edge). At each rising edge of the latching signal CLK, one latching circuit 214 captures a first sample of the (non-delayed) data input signal D and another latching circuit 218 captures a second sample of the delayed data signal DD. These latching circuits 214, 218 each provide a respective signal RD, RDD corresponding to the sample of data captured in the respective latching circuit 214, 218 responsive to rising edge of the latching signal CLK. At each falling edge of the latching signal CLK, one latching circuit 212 captures a third sample of the (non-delayed) data input signal D and another latching circuit 216 captures a fourth sample of the delayed data signal DD. These latching circuits 212, 216 also provide a respective signal FD, FDD corresponding to the sample of data captured responsive to the falling edge of the latching signal CLK. The logic level of the signals RD, RDD, FD, FDD provided by the sampling circuit 210A may vary somewhat with different types of latching circuits 212, 214, 216, 218. For example, if the latching circuits 212, 214, 216, 218 are level sensitive latches, then the latching circuits will be transparent approximately half of the time and latch the sample for the other half of the time. If flip-flops are used, however, the latching circuits 212, 214, 216, 218 would not be transparent but instead would have an output that transitions at most once per rising or once per falling edge of the latching signal CLK.

Figure 2B:
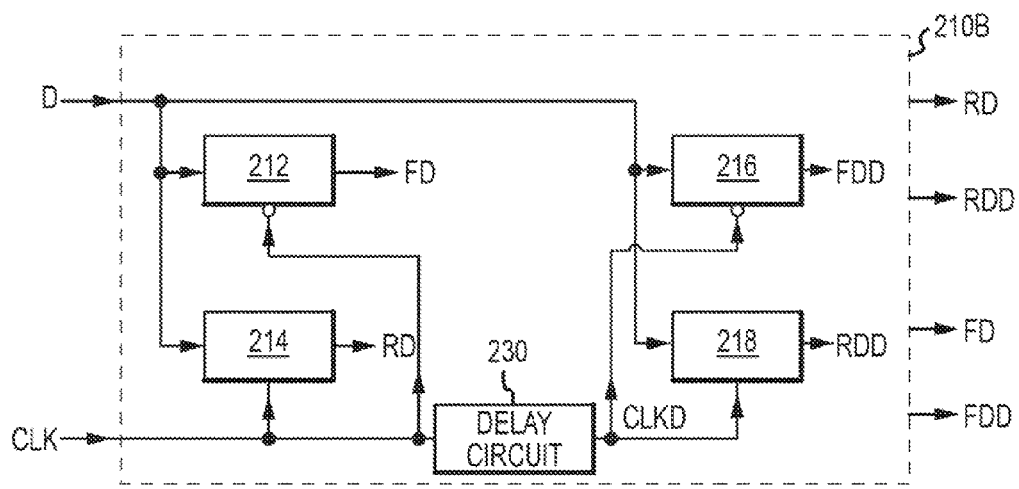
FIG. 2B is a schematic diagram of a sampling circuit according to an embodiment of the invention.

FIG. 2B illustrates another embodiment of a sampling circuit 210B that may be used in the apparatus 100 illustrated in FIG. 1. The sampling circuit 210B includes four latching circuits 212, 214, 216, 218, The latching circuits 212 214, 216 218 may be level sensitive latches, rising edge triggered flip-flops, falling edge triggered flip-flops, or any other type of latching circuit. A latching signal CLK is provided to two of the latching circuits 212, 214, and to a delay circuit 230, which may be similar to the delay circuit 230 described above with reference to FIG. 2A. The delay circuit 230 delays the latching signal CLK by a tD delay and provides a delayed clock signal CLKD, which in turn is provided to the other two latching circuits 216, 218. Similar to FIG. 2A, two of the latching circuits 212, 214 illustrated in FIG. 2B may be sensitive to falling edges of the latching signals CLK, CLKD while two of the latching circuits 216, 218 may be sensitive to rising edges of the latching signals CLK, CLKD. Also similar to FIG. 2A, many variations on the sampling circuit 210B may be implemented. Also as illustrated in FIG. 2B, the data input signal D is provided to all four of the latching circuits 212, 214, 216, 218.

In operation, the sampling circuit 210B illustrated in FIG. 2B captures fruit samples for each pulse of the latching signal (e.g., for each pair of a rising edge and a falling edge). At each rising edge of the (non-delayed) latching signal CLK, one latching circuit 214 captures a first sample of the data input signal D, and at the corresponding rising edge of the (delayed) latching signal CLKD another latching circuit 218 captures a second sample of the data input signal D. These latching circuits 214, 218 each provide a respective signal RD, RDD corresponding to the sample of data captured in the respective latching circuit 214, 218 responsive to rising edge of the latching signals CLK, CLKD. At each falling edge of the (non-delayed) latching signal CLK, one latching circuit 212 captures a third sample of the data input signal D, and at the corresponding falling edge of the (delayed) latching signal CLKD another latching circuit 216 captures a fourth sample of the data input signal D. These latching circuits 212, 216 also provide respective signals FD, FDD corresponding to the sample of data captured responsive to the falling edge of the latching signals CLK, CLKD. The samples captured by the sampling circuit 210B illustrated in FIG. 2B may be substantially similar to those captured by the sampling circuit 210A illustrated in FIG. 2A in some embodiments.

Although FIGS. 2A and 2B illustrate sampling circuits 210A, 210B with a delay circuit 230 that provides either a delayed data signal DD or a delayed clock signal CLKD, in some embodiments of a sampling circuit, both types of delay circuit 230 may be provided in a single sample circuit, and they both may be enabled and disabled so that, for example, only one is enabled at any given time.

Figure 3:
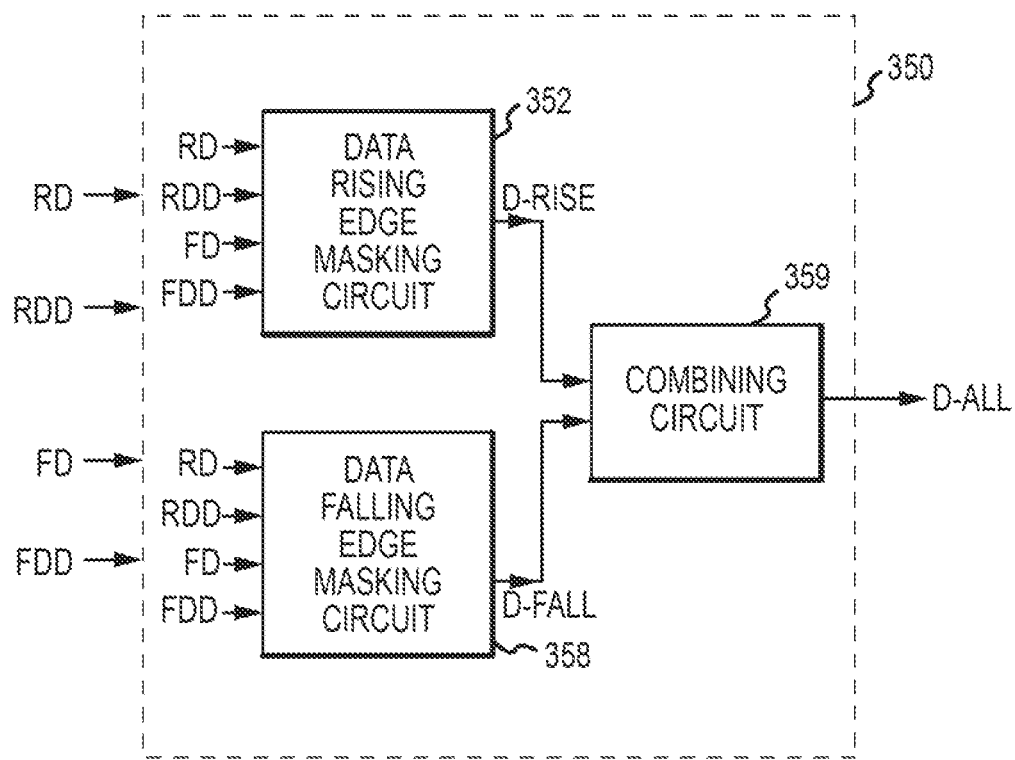
FIG. 3 is a block diagram of a masking circuit according to an embodiment of the invention.

FIG. 3 illustrates one embodiment of a masking circuit 350 that may be used in the apparatus 100 illustrated in FIG. 1. As described above, the masking circuit 350 receives the four signals RD, RDD, FD, FDD corresponding to the four samples provided by a sampling circuit, such as the sampling circuit 210A or 210B illustrated and described above. The masking circuit 350 also provides a decision signal D-ALL responsive to the four signals RD, RDD, FD, FDD. In some embodiments, the decision signal D-ALL is also responsive to the latching signal CLK.

The masking circuit 350 includes a data rising edge masking circuit 352 and/or a data falling edge masking circuit 358. A data rising edge masking circuit 352, if included in the masking circuit 350, provides a rising edge decision signal D-RISE responsive to the signals RD, RDD, FD, FDD. The data rising edge masking circuit 352 may include logic implementing a masking function that masks one or more of the signals RD, RDD, FD, FDD responsive to one or more of the samples corresponding to the respective signals RD, RDD, FD, FDD not sharing a common logic level with the other of the samples in order to help prevent metastability in the apparatus 100 when the data input signal rises. The data rising edge masking circuit 352 may in some embodiments not affect the functionality of the masking circuit 350 when the data input signal D has already risen (e.g., is at logic high) and/or when the data input signal D is falling.

Figure 4A:
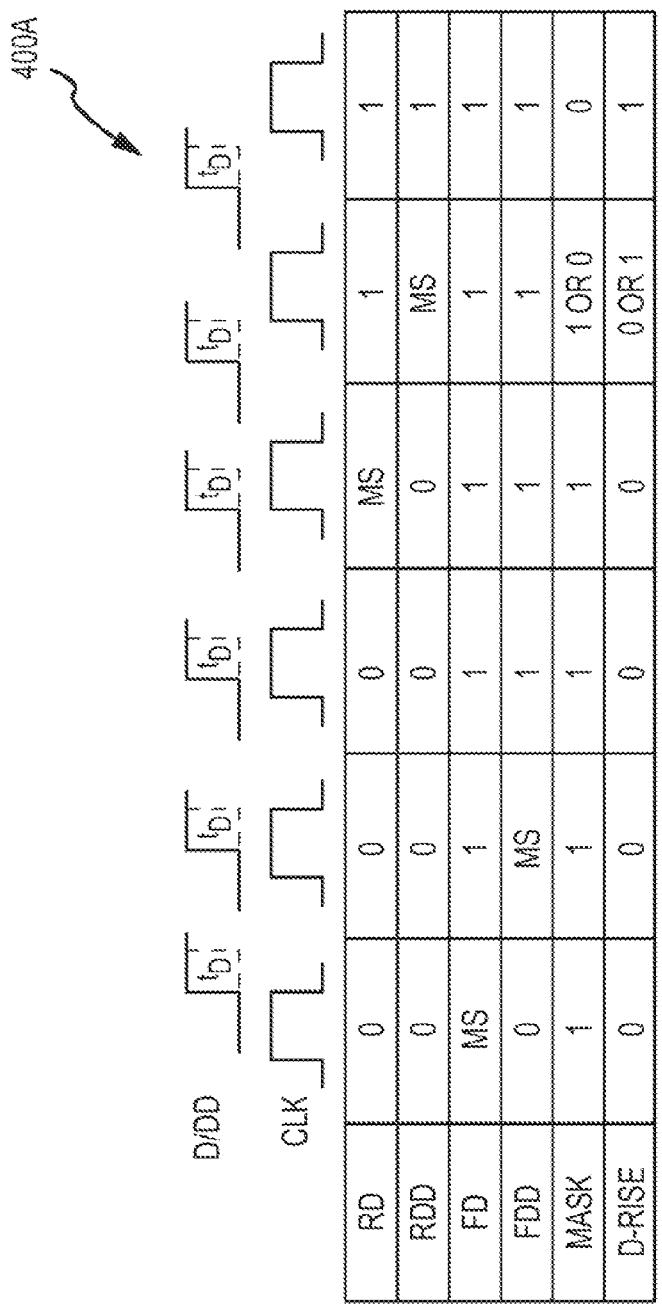
FIG. 4A is a table illustrating the operation of a data rising edge masking circuit according to an embodiment of the invention.

FIG. 4A is a partial table illustrating the functionality that may be implemented by the data using edge masking circuit 352 in order to provide the rising edge decision signal D-RISE. A plurality of different values for the signals RD, RDD, FD, FDD that may be received from a sampling circuit 110, 210A, 210B are illustrated in FIG. 4A, along with the values of a MASK value and the signal D-RISE that the data rising edge masking circuit 352 may provide in response. For convenience in understanding the table, a rising edge of the data input signal D, a rising edge of the delayed data signal DD (delayed by the tD delay), and a pulse of the latching signal CLK (including both a rising edge and a falling edge) are illustrated above each column.

In the first data column of the table illustrated in FIG. 4A, the data input signal D may rise at approximately the same time that the latching; signal CLK falls, thus creating the possibility that the latching element 212 enters a metastable state, which may cause the signal FD to be provided as an invalid logic level (indicated by MS in the table in FIG. 4A). In order to prevent the invalid logic level of the signal FD from causing metastability elsewhere in the apparatus 100 (e.g., by causing the output signal D-SYNC of the apparatus 100 to be an invalid logic level), the data rising edge masking circuit 352 may mask the logic level of the FD signal so that the D-RISE signal stays at logic low, or in other words may mask the logic level of the FD signal from impacting the logic level of the D-RISE signal and therefore mask the rising transition of the data input signal D. In some embodiments, rather than mask the logic level of the FD signal, the data rising edge masking circuit 352 may mask the logic level of the other signals FDD, RD, RDD, may mask the logic level, of the rising edge decision signal D-RISE, or may mask a different signal. As indicated in the table, the MASK value is logic high, which indicates that the mask is active, though the mask may not be a physical mask in some embodiments. For example, the mask may be inherent in logic gates within the data rising edge masking circuit 352 that are configured to delay the rising edge decision signal D-RISE from transitioning to logic high when the data input signal D rises at approximately the same time as the latching signal CLK falls.

In the second data column of the table illustrated in FIG. 4A, the delayed data signal DD may rise at approximately the same time that the latching signal CLK falls, thus creating the possibility that the latching element 212 enters a metastable state, which may cause the signal FDD to be provided as an invalid logic level (indicated by MS in the table in FIG. 4A). In order to prevent the invalid logic level of the signal FDD from causing metastability elsewhere in the apparatus 100 (e.g., by causing the output signal D-SYNC of the apparatus 100 to be an invalid logic level), the data rising edge masking circuit 352 ma mask the logic level of the FDD signal so that the D-RISE signal stays at logic low, or in other words may mask the logic level of the FDD signal from impacting the logic level of the D-RISE signal and therefore mask the rising transition of the data input signal D. In some embodiments, the data rising edge masking circuit 352 may mask the logic level of other signals, including for example the FD signal. As indicated in the table, the MASK value is logic high, which indicates that the mask is active, though the mask may not be a physical mask in some embodiments. For example, the mask may be inherent in logic gates within the data rising edge masking circuit 352 that are configured to delay the rising edge decision signal D-RISE from transitioning to logic high when the delayed data signal DD rises at approximately the same time as the latching signal CLK falls.

In the third data column of the table illustrated in FIG. 4A, the data input signal D and the delayed data signal DD may both rise in between the rising and falling edges of the latching signal CLK. Even though none of the latching elements 212, 214, 216, 218 may be likely to enter a metastable state in this situation, the data rising edge masking circuit 352 may nonetheless mask the logic level of the FD and FDD signals so that the D-RISE signal stays at logic low, or in other words may mask the logic level of the FD and FDD signals from impacting the logic level of the D-RISE signal and therefore mask the rising transition of the data input signal D. In some embodiments, the data rising edge masking circuit 352 may mask the logic level of other signals. As indicated in the table, the MASK value is logic high, which indicates that the mask is active, though the mask may not be a physical mask in some embodiments. For example, the mask may be inherent in logic gates within the data rising edge masking circuit 352 that are configured to delay the rising edge decision signal D-RISE from transitioning to logic high when the data input signal D and the delayed data signal DD rise in between the rising and falling edges of the latching signal CLK.

In the fourth data column of the table illustrated. in FIG. 4A, the data input signal D may rise at approximately the same tine that the latching signal CLK rises, thus creating the possibility that the latching element 214 enters a metastable state, which may cause the signal RD to be provided as an invalid logic level (indicated by MS in the table in FIG. 4A). In order to prevent the invalid logic level of the signal RD from causing metastability elsewhere in the apparatus 100 (e.g., by causing the output signal D-SYNC of the apparatus 100 to be an invalid logic level), the data rising edge masking circuit 352 may mask the logic level of the RD signal so that the D-RISE signal stays at logic low, or in other words may mask the logic level of the RD signal from impacting the logic level of the D-RISE signal and therefore mask the rising transition of the data input signal D. In some embodiments, the data rising edge masking circuit 352 may mask the logic level of other signals, including for example the FD and FDD signals. As indicated in the table, the MASK value is logic high, which indicates that the mask is active, though the mask may not be a physical mask in some embodiments. For example, the mask may be inherent in logic gates within the data rising edge masking circuit 352 that are configured to delay the rising edge decision signal D-RISE from transitioning to logic high when the data input signal D rises at approximately the same time as the latching signal CLK rises.

In the fifth data column of the table illustrated in FIG. 4A, the delayed data signal DD may rise at approximately the same time that the latching signal CLK rises, thus creating the possibility that the latching element 218 enters a metastable state, which may cause the signal RDD to be provided as an invalid logic level (indicated by MS in the table in FIG. 4A). In order to prevent the invalid logic level of the signal RDD from causing metastability elsewhere in the apparatus 100 (e.g., by causing the output signal D-SYNC of the apparatus 100 to be an invalid logic level), the data rising edge masking circuit 352 may mask the logic level of the RDD signal so that the D-RISE signal stays at logic low, or in other words may mask the logic level of the RDD signal from impacting the logic level of the D-RISE signal and therefore mask the rising transition of the data input signal D. In some embodiments, the data rising edge masking circuit 352 may mask the logic level of other signals, including for example the FD, FDD, and/or RD signals. As indicated in the table, the MASK value may be logic high or may be logic low; the choice between logic high and logic low may be a design choice. Accordingly, the D-RISE signal provided by the data rising edge masking circuit may be either logic low or logic high.

In the last data column of the table illustrated, in FIG. 4A, the data input signal D and the delayed data signal DD both rise before the rising edge of the latching signal CLK, and so none of the latching elements 212, 214, 216, 218 may enter a metastable state in this situation. Accordingly, the MASK value may be logic low, and the data rising edge masking circuit may provide the D-RISE signal as logic high. No masking may be needed for this situation because the data input signal D rises sufficiently before the rising edge of the latching signal CLK.

Returning to FIG. 3, some embodiments of the masking circuit 350 may include a data falling edge masking circuit 358. A data falling edge masking circuit 358, if included in the masking circuit 350, provides a falling edge decision signal D-FALL responsive to the signals RD, RDD, FD, FDD. The data falling edge masking circuit 358 may include logic implementing a masking function that masks one or more of the signals RD, RDD, FD, FDD responsive to one or more of the samples corresponding to the respective signals RD, RDD, FD, FDD not sharing a common logic level with the other of the samples in order to help prevent metastability in the apparatus 100 when the data input signal D falls. The data falling edge masking circuit 358 may in some embodiments not affect the functionality of the masking circuit 350 when the data input signal D has already fallen (e.g., is at logic low) and/or when the data input signal D is rising.

Figure 4B:
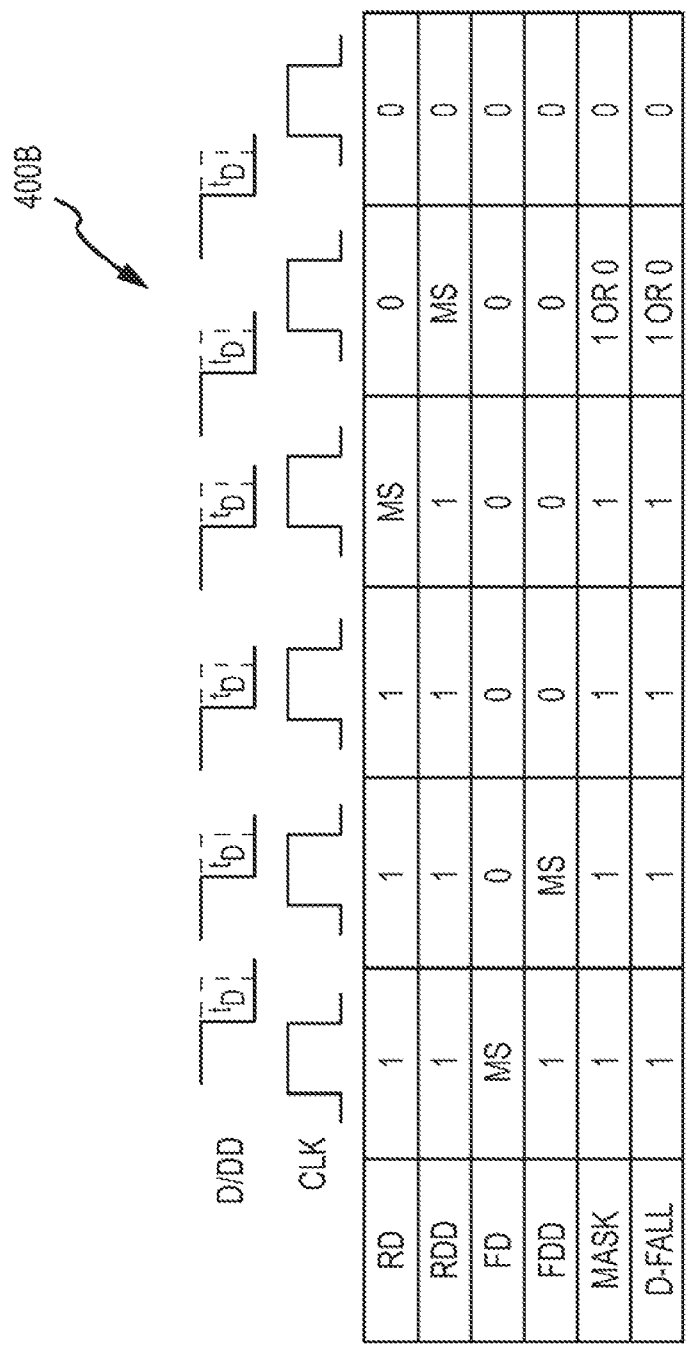
FIG. 4B is a table illustrating the operation of a data falling edge masking circuit according to an embodiment of the invention.

FIG. 4B is a partial table illustrating the functionality that may be implemented by the data falling edge masking circuit 3587 in order to provide the falling edge decision signal D-FALL. A plurality of different values for the signals RD, RDD, FD, FDD that may be received from a sampling circuit 110, 210A, 210B are illustrated in FIG. 4B, along with the values of a MASK value and the D-FALL signal that the data falling edge masking circuit 358 may provide in response. For convenience in understanding the table, a falling edge of the data input signal D, a falling edge of the delayed data signal DD (delayed by the tD delay), and a pulse of the latching signal CLK (including both a rising edge and a falling edge) are illustrated above each column.

The data columns in the table illustrated in FIG. 4B may generally be similar and/or complementary to the data columns illustrated in FIG. 4A.

The masking circuit 350 may also in some embodiments include a combining circuit 359 in order to, for example, combine the output of the data rising edge circuit 352 and the output of the data falling edge masking circuit 358, or simply to provide the results of one of the data rising edge data circuit 352 or the data falling edge masking circuit 358 as the decision signal D-ALL. The combining circuit 359 may in some embodiments selectively enable the propagation of the D-RISE and D-FALL signals as the D-ALL signal. For example, the combining circuit 359 may provide the D-RISE signal as the D-ALL signal when the data input signal D is rising and may provide the D-FALL signal as the D-ALL signal when the data input signal D is falling, and the combining circuit 359 may do this in any of a number of different ways (e.g., if the combining circuit 359 includes a multiplexor). The combining circuit 359 may alternatively be an AND or a NAND gate, or a different logic gate or combination of logic gates. Some embodiments of a masking circuit 350 (such as those that having only a data rising edge masking circuit 352 or having only a data falling edge masking circuit 358) may not include a combining circuit 359.

Figure 5:
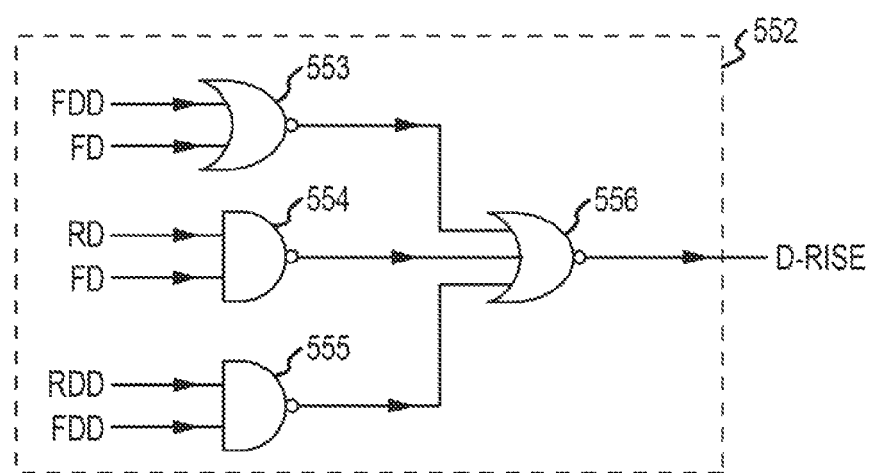
FIG. 5 is a schematic diagram of a data rising edge masking circuit according to an embodiment of the invention.

FIG. 5 illustrates one embodiment of a data rising edge logic circuit 552 that may be used for the data rising edge logic circuit 352 in FIG. 3. The data rising edge logic circuit 552 includes a 2-input NOR gate 553 that receives the FDD and FD signals, a 2-input NAND gate 554 that receives the RD and FD signals, and a 2-input NAND gate 555 that receives the RDD and FDD signals from a sampling circuit 110, 210A, 210B. The outputs of the NOR gate 553 and the two NAND gates 554, 555 are provided to a 3-input NOR gate 556, which in response provides the D-RISE signal. In operation, the data rising edge logic circuit 552 may implement the functionality illustrated in the table of FIG. 4A and illustrated above. In sonic embodiments, the respective sizes, drive strengths, layouts, etc. of the gates 553, 554, 555, 556 may be different and/or non-standard in order to implement the functionality illustrated in the table of FIG. 4A (e.g., the NAND gate 555 may favor pulling its output to logic high and the NOR gate 556 may favor pulling its output to logic low). As illustrated in FIG. 5, the delay through the data rising edge logic circuit 552 may be approximately two gates long in some embodiments.

Figure 6A:
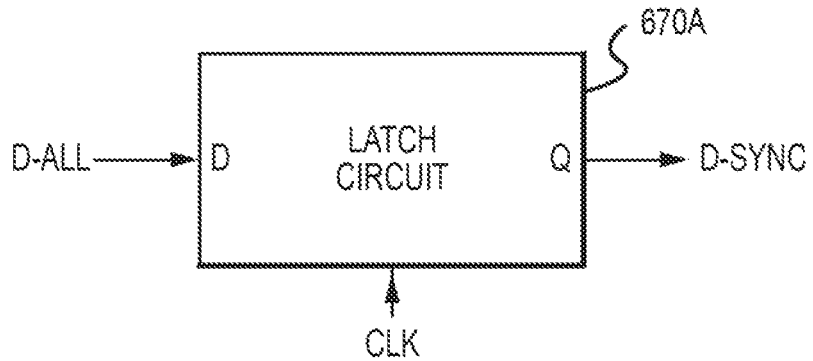
FIG. 6A is a schematic diagram of a sync circuit according to an embodiment of the invention.
Figure 6B:
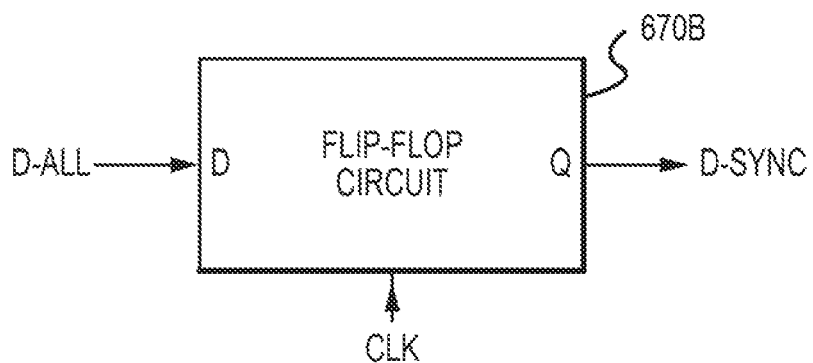
FIG. 6B is a schematic diagram of a sync circuit according to an embodiment of the invention.
Figure 6C:
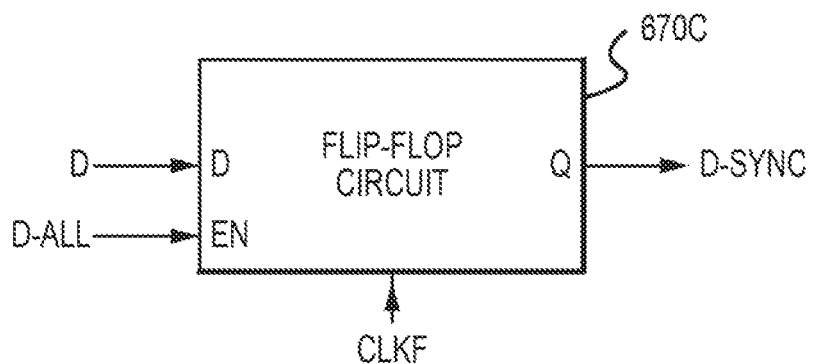
FIG. 6C is a schematic diagram of a sync circuit according to an embodiment of the invention.

FIGS. 6A through 6C illustrate different embodiments of a sync circuit 670A 670B, 670C that may be used for the sync circuit 170 of FIG. 1. FIG. 6A illustrates an embodiment of a sync circuit that includes a level sensitive latch 670A. The level sensitive latch 670A receives the decision signal D-ALL and the latching signal CLK, and, in response, provides the output signal D-SYNC. In operation, the level sensitive latch 670A provides the decision signal D-ALL as the output signal D-SYNC responsive to the latching signal CLK being logic low, latches the decision signal D-ALL at the rising edge of the latching signal CLK, and holds that latched logic level of the decision signal D-ALL responsive to the latching signal CLK being logic high.

FIG. 6B illustrates another embodiment of a sync circuit that includes a rising edge triggered flip-flop circuit 670B. The flip-flop circuit 670B receives the decision signal D-ALL and the latching signal CLK, and, in response provides the output signal D-SYNC. In operation, the flip-flop circuit 670B latches the decision signal D-ALL at the rising edge of the latching signal CLK and holds that latched logic level until the next rising edge of the latching signal CLK. Alternatively, a falling edge triggered flip-flop could be used for the sync circuit illustrated in FIG. 6B.

FIG. 6C illustrates another embodiment of a sync circuit that includes an enableable flip-flop circuit 670C. The enableable flip-flop circuit 670C receives the decision signal D-ALL at the enable node of the flip-flop circuit 670C, receives the data input signal D at the data input node of the flip-flop circuit 670C, and receives a latching signal CLKF as well, which may be substantially complementary to the latching signal CLK as described above. In response to receiving these three signals D-ALL, D, CLKF, the flip-flop circuit 670C provides the output signal D-SYNC. In operation, the flip-flop circuit 670C latches the data input signal D logic level if the decision signal D-ALL enables the flip-flop circuit 670C, and holds that latched logic level until the next rising edge of the latching signal CLKF when the decision D-ALL enables the flip-flop circuit 670C.

Figure 7:
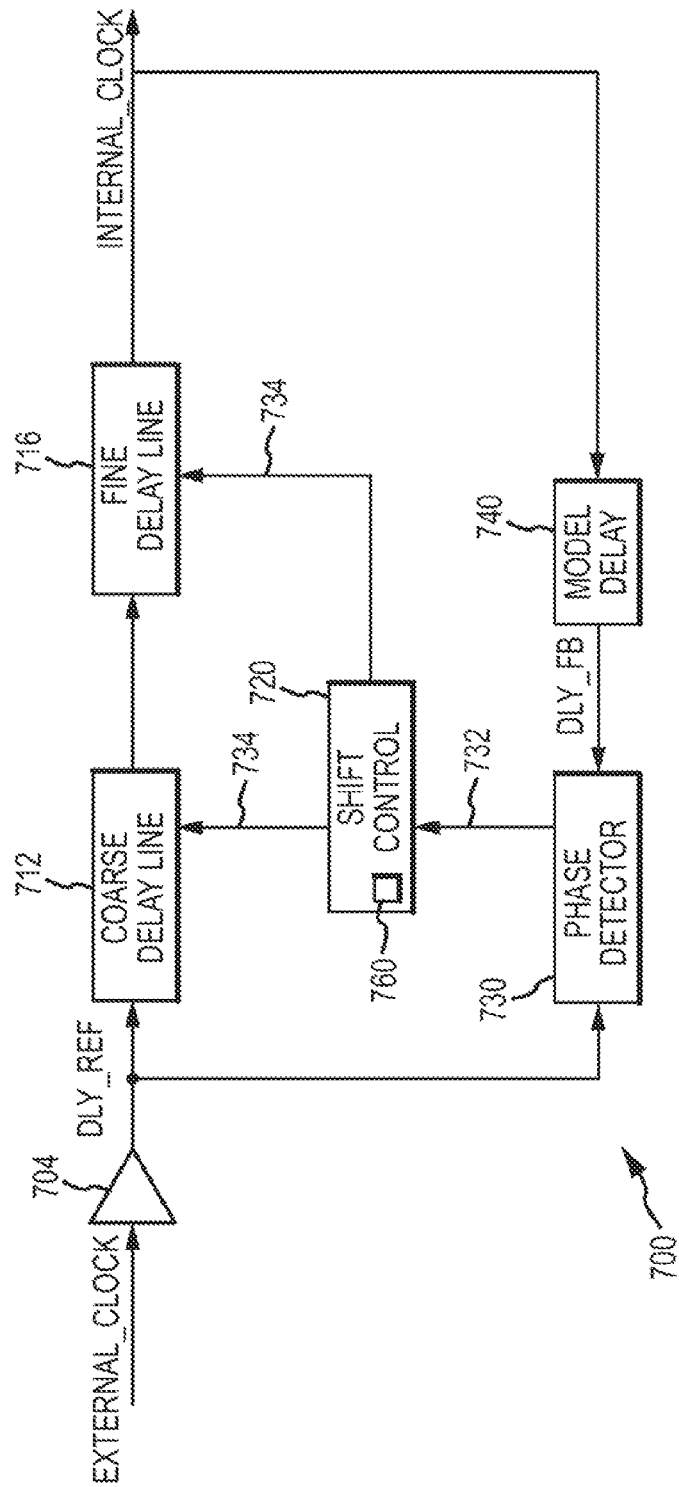
FIG. 7 is a block diagram of a delay-locked loop (DLL) according to an embodiment of the invention.

FIG. 7 illustrates a DLL circuit 700 for providing an approximate delay that matches the phase difference between input and output dock signals. The DLL circuit 700 uses a feedback configuration that operates to feedback a phase difference-related signal to control one or more delay lines, such as a coarse delay line 712 and a fine delay line 716, for advancing or delaying the timing of one clock signal to "lock" to a second clock signal. The DLL 700 includes an apparatus 760 that may help reduce or eliminate metastability in one or more portions of the DLL.

An EXTERNAL_CLOCK signal is initially provided to the DLL circuit 700 and received by an input buffer 704 that provides a buffered clock signal DLY_REF to the DLL circuit: 700. The DLY_REF signal is delayed relative to the external clock signal due to a propagation delay of the input buffer 704. The DLY_REF signal is then provided to coarse and fine delay lines 712, 716, which include a number of delay stages that are selected by a shift control 720 to provide a measured delay for adjusting the phase of the DLY_REF signal. The shift control 720 controls adjustments to the coarse and fine delay lines 712, 716 by providing shift control signals 734 in response to receiving control signals 732 from a phase detector 730. In response to the shift control signals 734, the coarse delay line 712 provides a measured delay to adjust the phase of the DLY_REF signal near the desired phase for achieving the phase lock condition. The fine delay line 716 provides smaller delay adjustments to "fine tune" the DLY_REF signal closer to the desired phase lock condition. The coarse and fine delay lines 712, 716 generate an output signal INTERNAL_CLOCK.

The INTERNAL_CLOCK signal is provided to the model delay circuit 740, which duplicates inherent delays added to the provided external clock signal as it propagates through the delay loop, such as the input buffer 704. The model delay circuit 740 then provides a feedback signal DLY_FB to the phase detector 730. The phase detector 730 compares the phases of the DLY_REF signal and the DLY_FB signal to determine whether the locking condition has been achieved and to generate shift selection signals 732 to the shift control 720 to control the coarse or fine delay lines 712. 716. The shift selection signal instructs the shift control 720 to increase the delay of the coarse or fine delay lines 712, 716 when the DLY_FB signal leads the DLY_REF signal, or decrease the delay in the opposite case.

In some embodiments, the fine delay line 716 may initially be inactive while the DLL 700 attempts to roughly lock the phase of the INTERNAL_CLOCK signal with the EXTERNAL_CLOCK signal by actively changing the delay introduced by the coarse delay line 712 with relatively large steps of increased delay. Once the phase of the INTERNAL_CLOCK signal is roughly similar to the EXTERNAL_CLOCK signal, an asynchronous control signal may cause the shift control 720 deactivate the coarse delay line 712 and activate the fine delay line. The asynchronous control signal may need to be synchronized in some embodiments in order to help prevent partial pulse shift control signals 734 from being provided to either the coarse delay line 712 or the fine delay line 716, and/or in order to help prevent any overlap between the shift control signals 734 provided to the coarse delay line 712 and the shift control signals 734 provided to the fine delay line 716.

In order to help synchronize the asynchronous control signal, an apparatus 760, similar to the apparatus 100 described above, may be included in the shift control 720. The apparatus 760 may receive the asynchronous control signal and may provide a synchronous signal to the shift control 720, which in turn provides appropriate shift control signals 734 to the coarse delay line 712 and the fine delay line 716.

Figure 8:
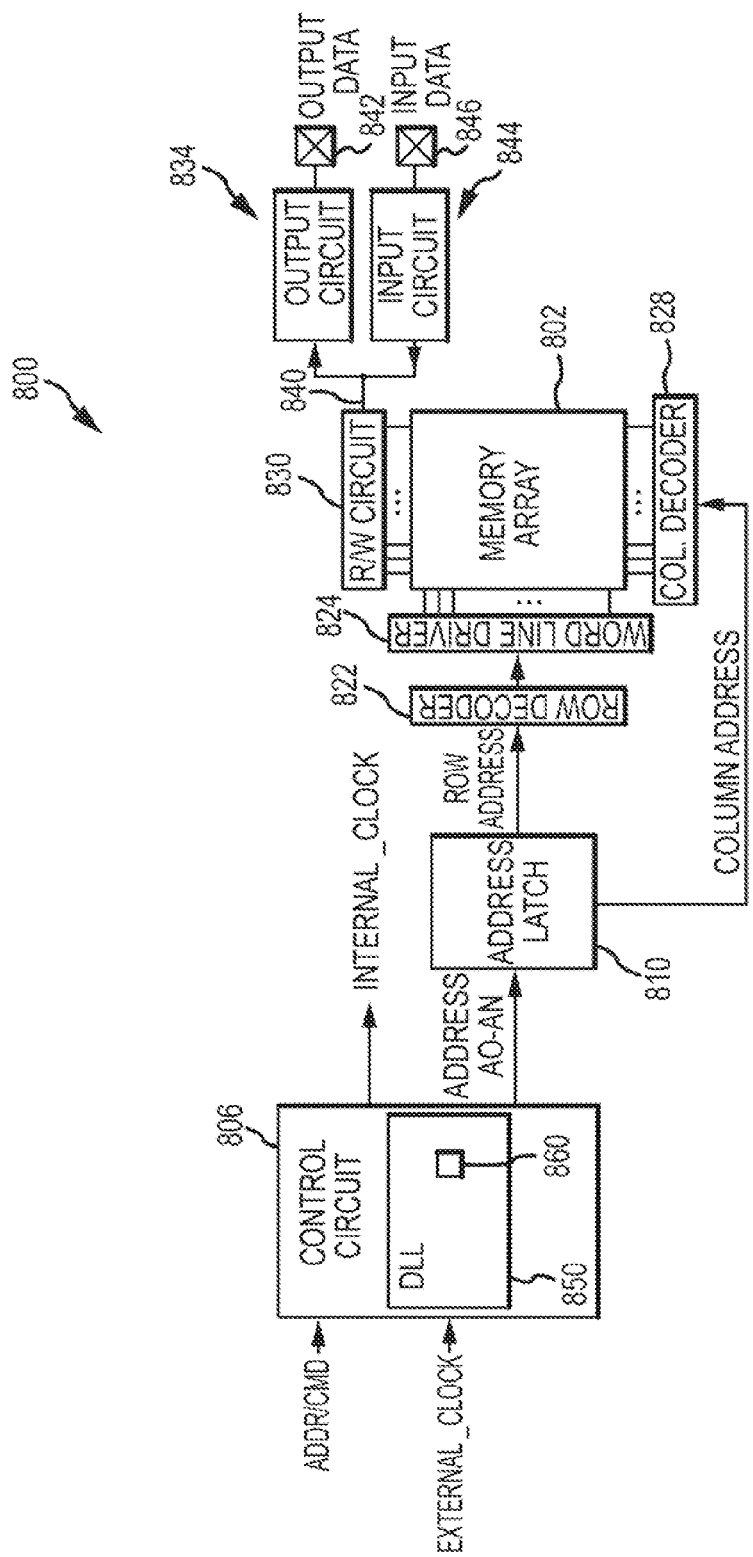
FIG. 8 is a block diagram of a memory according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a control circuit 806 that receives memory commands and addresses through an ADDR/CMD bus. The control circuit 806 provides control signals, based on the commands received through the ADDR/CMD bus. The control circuit 806 also provides row and column addresses to the memory 800 through an address bus and an address latch 810. The address latch then outputs separate column addresses and separate row addresses.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line, or bit lines) corresponding to a received column address are coupled to a read/write circuitry 830 to provide read data to a data output circuit 834 via an input-output data bus 840. An output pad 842 coupled to the data output circuit 834 is used for electrically coupling to the memory 800. Write data are provided to the memory array 802 through a data input circuit 844 and the memory array read/write circuitry 830. An input pad 846 coupled to the data input circuit 842 is used for electrically coupling to the memory 800. The control circuit 806 responds to memory commands and addresses provided to the ADDR/CMD bus to perform various operations on the memory array 802. In particular, the control circuit 806 is used to provide internal control signals to read data from and write data to the memory array 802.

The control circuit 806 in FIG. 8 also includes a DLL 850 that may be, for example, the DLL 700 described herein in connection with FIG. 7, or a similar DLL. The DLL 850 may include an apparatus 860 that may be similar to the apparatuses 100, 760 described above, or a similar apparatus. The apparatus 860 may be configured to help prevent metastability in the DLL 700.

Alternatively or in addition to the apparatus 860 in the DLL 850, the memory 800 may include an apparatus similar to the apparatus 100 described above in many different locations (not illustrated in FIG. 8). As just one additional example, a high speed data interface of the memory 800 may be included in the control circuit 806 and may include one or more apparatuses in order to help synchronize data, addresses, and/or commands received by the memory 800. In general, the memory 800 may include one or more apparatuses similar to the apparatus 100 described above in many different locations.

From the foregoing it will be appreciated that, although specific embodiments of the invention have been described herein for purposes of illustration, various modifications may be made without deviating from the spirit and scope of the invention. For example, FIGS. 1, 7, and 8 illustrate embodiments of an apparatus 100, 760, 860, FIGS. 1, 2A and 2B illustrate embodiments of a sampling circuit 110, 210A, 210B, FIGS. 1, 3, and 5 illustrate embodiments of a masking circuit 150, 350, 552, FIGS. 1, 6A, 6B, 6C illustrate embodiments of a sync circuit, and so forth. However, other apparatuses, sampling circuits, masking circuits, sync circuits and so forth may be used, which are not limited to having the same design, and may be of different designs and include circuitry different from the circuitry in the embodiments illustrated in these Figures. As used herein, an apparatus may refer to a number of different things, such as circuitry, a memory device, a memory system (e.g., SSD) or an electronic device or system (e.g., a computer smart phone, server, etc.).

Accordingly, the invention is not limited except as by the appended claims.

What is claimed is:

1. An apparatus, comprising:
a sampling circuit configured to receive an input signal and further configured to provide a plurality of samples of the input signal responsive to a rising edge and a falling edge of a latch signal; and
a masking circuit configured to selectively mask one of the plurality of samples based on that sample of the plurality of samples not sharing a common logic level with at least one of the other samples of the plurality of samples.

2. The apparatus of claim 1, further comprising a synchronization circuit configured to receive a control signal provided by the masking circuit and the synchronization circuit further configured to provide a synchronous output responsive to the control signal and the latch signal, wherein the control signal is based on the masking circuit selectively masking the sample of the plurality of samples.

3. The apparatus of claim 1, wherein the sampling circuit is further configured to selectively delay the input signal and provide the delayed input signal as at least one of the plurality of samples of the input signal responsive to the rising edge or the falling edge of the latch signal.

4. The apparatus of claim 1, wherein the sampling circuit is further configured to selectively delay the latch signal and provide at least one of the plurality of samples of the input signal responsive to a rising edge or a falling edge of the delayed latch signal.

5. The apparatus of claim 1, wherein a subset of the plurality of samples are delayed versions of the input signal.

6. The apparatus of claim 1, wherein the masking circuit is further configured to determine a relation of a rising edge and a falling edge of each of the plurality of samples of the input signal to a falling edge and a rising edge of the latch signal.

7. An apparatus, comprising:
a first circuit configured to provide four samples of an input signal responsive to the relation of the input signal to a falling edge and a rising edge of a clock signal, wherein two of the samples are based on the rising edge of the clock signal and two of the samples are based on the falling edge of the clock signal; and
a second circuit configured to receive the four samples, determine if two or more of the samples share a common logic level value, and provide a control signal to a synchronization circuit based at least in part on at least one of the samples not sharing the common logic value with at least one of the other four samples, wherein the control signal masks one or more of the samples that do not share a common logic level value.

8. The apparatus of claim 7, wherein the first circuit comprises an adjustable delay configured to delay the input signal and provide a delayed input signal.

9. The apparatus of claim 8, wherein the first circuit further comprises four latches with each of the latches configured to receive the clock signal and wherein two of the latches are configured to receive the input signal and to provide a sample of the input signal based on the clock signal, and wherein two of the latches are configured to receive the delayed input signal and to provide a sample of the delayed input signal based on the clock signal.

10. The apparatus of claim 9, wherein an input signal and a delayed input signal are sampled based on the rising edge of the clock signal and an input signal and a delayed input signal are sampled based on the falling edge of the clock signal.

11. The apparatus of claim 7, further comprising a synchronization circuit configured to receive the control signal and the clock signal and to provide a synchronized data signal based on the control signal and the clock signal.

12. The apparatus of claim 7, wherein the second circuit comprises a data falling edge masking circuit and a data rising edge masking circuit, and wherein the data falling edge and the data rising edge masking circuits are configured to receive the four samples and to determine if any of the four samples is not at the same logic level as at least one of the other four samples and further configured to provide a signal indicating whether the input signal is at a logic level high or a logic level low relative to the falling edge or the rising edge of the clock signal, respectively.

13. The apparatus of claim 12, further comprising a combining circuit configured to receive the signals indicating whether the input signal is at a logic level high or a logic level low relative to the falling edge or the rising edge of the clock signal from the data falling edge masking circuit and from the data rising edge masking circuit and to combine the two signals to provide the control signal.

14. The apparatus of claim 7, wherein the second circuit is configured to mask a sample based on the sample not sharing the common logic value with the other three samples.

15. The apparatus of claim 7, wherein the second circuit is configured to mask a transition of the input signal by delaying a propagation of the input signal to an output of a synchronization circuit until a next rising edge of the clock signal.

16. A method, comprising:
sampling, by a sampling circuit, a data signal a plurality of times relative to a rising edge and a falling edge of a clock signal to provide a plurality of samples;
determining, by a masking circuit, whether any of the plurality of samples does not share a common logic level with any of the other plurality of samples; and
masking, by the masking circuit, a sample of the plurality of samples based on that sample not sharing a common logic level with at least one other sample of the plurality of samples.

17. The method of claim 16, further comprising providing, by the masking circuit, a control signal based at least in part on the masking of the sample of the plurality of samples.

18. The method of claim 16, further comprising providing, by a synchronization circuit, a synchronized data signal, wherein the data signal is synchronized with the clock signal.

19. The method of claim 16, further comprising:
delaying, by the sampling circuit, the data signal to provide at least one delayed data signal; and
sampling, by the sampling circuit, the at least one delayed data signal relative to the clock signal to provide one of the plurality of samples.

20. The method of claim 16, further comprising selectively delaying, by the sampling circuit, the data signal to provide a delayed data signal.

21. The method of claim 20, wherein sampling, by the sampling circuit, a data signal a plurality of times relative to a clock signal to provide a plurality of samples further comprises sampling, by the sampling circuit, the data signal and the delayed data relative to the falling edge and the rising edge of the clock signal.

* * * * *